US012249562B2

(12) United States Patent
Niu et al.

(10) Patent No.: US 12,249,562 B2
(45) Date of Patent: Mar. 11, 2025

(54) INTELLIGENT POWER MODULE CONTAINING EXPOSED SURFACES OF TRANSISTOR DIE SUPPORTING ELEMENTS

(71) Applicant: ALPHA AND OMEGA SEMICONDUCTOR INTERNATIONAL LP, Toronto (CA)

(72) Inventors: Zhiqiang Niu, Santa Clara, CA (US); Bum-Seok Suh, Seongnam (KR); Junho Lee, Suwon-si (KR); Jong-Mu Lee, Yongin-si (KR); Xiaorong Ge, Pleasanton, CA (US)

(73) Assignee: ALPHA AND OMEGA SEMICONDUCTOR INTERNATIONAL LP, Toronto (CA)

( * ) Notice: Subject to any disclaimer, the term of this patent is extended or adjusted under 35 U.S.C. 154(b) by 543 days.

(21) Appl. No.: 17/683,354

(22) Filed: Mar. 1, 2022

(65) Prior Publication Data

US 2023/0282554 A1 Sep. 7, 2023

(51) Int. Cl.
*H01L 23/495* (2006.01)
*H01L 23/00* (2006.01)
*H01L 23/31* (2006.01)
*H02P 29/00* (2016.01)

(52) U.S. Cl.
CPC .... *H01L 23/49575* (2013.01); *H01L 23/3107* (2013.01); *H01L 23/49555* (2013.01); *H01L 23/49562* (2013.01); *H01L 24/48* (2013.01); *H01L 2224/48137* (2013.01); *H02P 29/00* (2013.01)

(58) Field of Classification Search
CPC .......... H01L 23/49575; H01L 23/3107; H01L 23/49555; H01L 23/49562; H01L 24/48; H01L 2224/48137; H01L 23/49551; H01L 23/13; H01L 23/31; H01L 23/49; H01L 25/16; H01L 25/18; H02P 29/00; H02M 7/003; H02M 7/5387
See application file for complete search history.

(56) References Cited

U.S. PATENT DOCUMENTS

| | | | |
|---|---|---|---|
| 9,754,864 B1* | 9/2017 | Xue | ............... H01L 23/49562 |
| 10,600,727 B2 | 3/2020 | Niu et al. | |
| 11,322,459 B2 | 5/2022 | Furutani | |
| 2007/0052379 A1* | 3/2007 | Suh | .................. H03K 17/6871 |
| | | | 318/400.26 |
| 2017/0053855 A1* | 2/2017 | Lam | ..................... H01L 21/561 |
| 2017/0372987 A1* | 12/2017 | Xue | .................. H01L 23/49555 |
| 2019/0295939 A1* | 9/2019 | Ko | ......................... H01L 23/50 |
| 2020/0388580 A1* | 12/2020 | Furutani | ................ H01L 25/07 |

\* cited by examiner

*Primary Examiner* — Robert G Bachner
(74) *Attorney, Agent, or Firm* — Chen-Chi Lin

(57) ABSTRACT

An intelligent power module (IPM) comprises a first transistor die supporting element, a second transistor die supporting element, a third transistor die supporting element, and a fourth transistor die supporting element, a first transistor, a second transistor, a third transistor, a fourth transistor, a fifth transistor, a sixth transistor, a tie bar, a low voltage IC, a high voltage IC, a plurality of leads, a first slanted section, a second slanted section, a third slanted section, a fourth slanted section, a fifth slanted section, and a molding encapsulation. A respective bottom surface of each of the first, second, third, and fourth transistor die supporting elements are exposed from the molding encapsulation.

20 Claims, 7 Drawing Sheets

INTELLIGENT POWER MODULE CONTAINING EXPOSED SURFACES OF TRANSISTOR DIE SUPPORTING ELEMENTS

FIELD OF THE INVENTION

This invention relates generally to a molded intelligent power module (IPM) for driving a motor. More particularly, the present invention relates to a molded IPM containing exposed surfaces of transistor die supporting elements.

BACKGROUND OF THE INVENTION

IPMs, including gate drives and protection integrated circuits (ICs), are applied in compact and high power density applications. It is challenging to improve the thermal performance of the IPM.

Bottom surfaces of transistor die supporting elements are exposed from molding encapsulation so as to facilitate directly soldering the exposed surfaces onto a printed circuit board (PCB) thereby improving the thermal performance and simplifying the integration process.

SUMMARY OF THE INVENTION

An IPM comprises a first transistor die supporting element, a second transistor die supporting element, a third transistor die supporting element, and a fourth transistor die supporting element, a first transistor, a second transistor, a third transistor, a fourth transistor, a fifth transistor, a sixth transistor, a tie bar, a low voltage IC, a high voltage IC, a plurality of leads, a first slanted section, a second slanted section, a third slanted section, a fourth slanted section, a fifth slanted section, and a molding encapsulation.

A respective bottom surface of each of the first, second, third, and fourth transistor die supporting elements are exposed from the molding encapsulation.

DETAILED DESCRIPTION OF THE INVENTION

Figure 1:
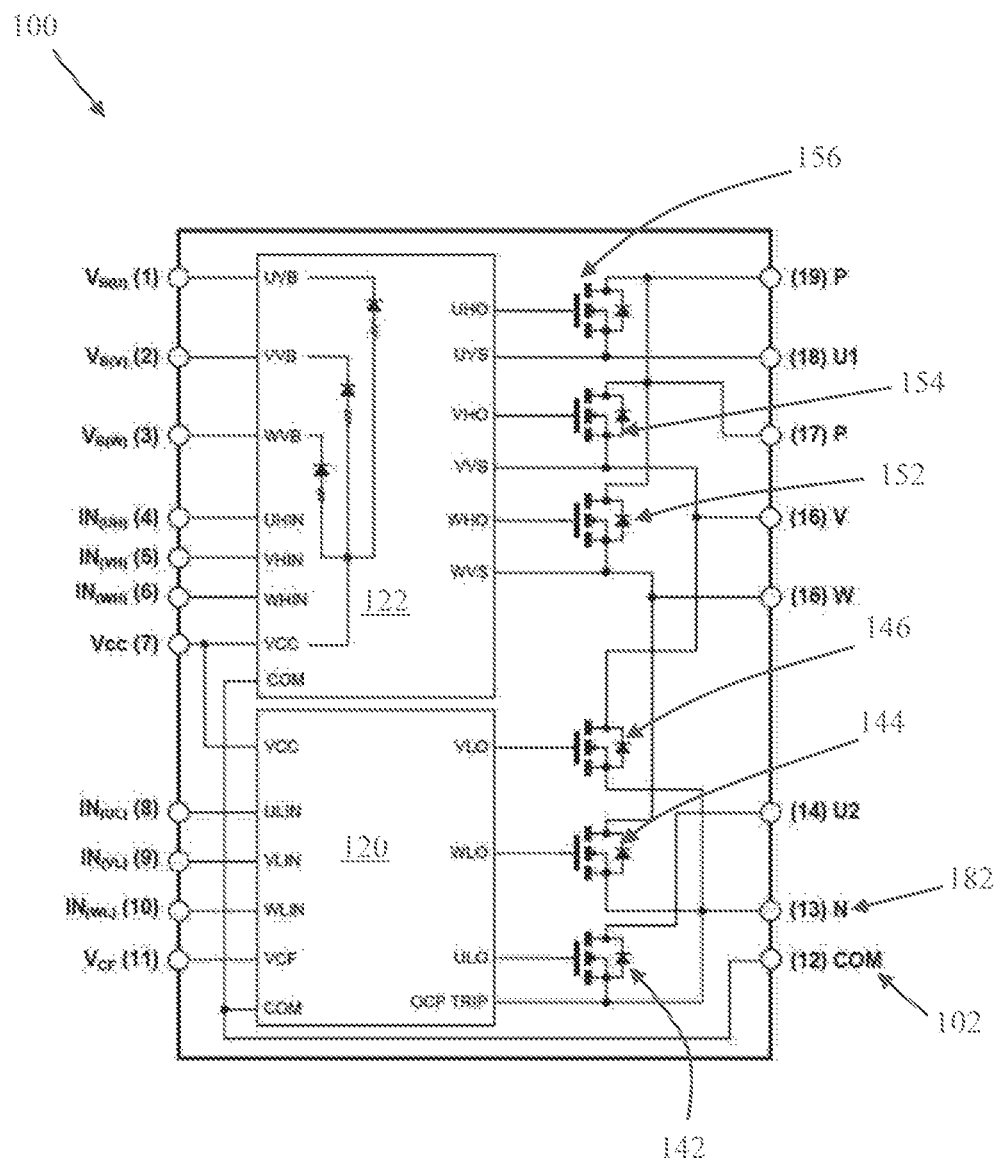
FIG. 1 is a circuit diagram of an intelligent power module (IPM) for driving a motor in examples of the present disclosure.

FIG. 1 is a circuit diagram of an intelligent power module (IPM) 100 for driving a motor in examples of the present disclosure. A low voltage integrated circuit (IC) 120 controls a first transistor 142, a second transistor 144 and a third transistor 146. A high voltage IC 122 controls a fourth transistor 152, a fifth transistor 154 and a sixth transistor 156. In examples of the present disclosure, the transistors are metal-oxide-semiconductor field-effect transistors (MOSFETs). In examples of the present disclosure, the transistors are insulated gate bipolar transistors (IGBTs). There is only one shunt pin 182. The shunt pin 182 is adjacent to the common pin 102. In examples of the present disclosure, there is no other pins between the shunt pin 182 and the common pin 102.

Figure 2:
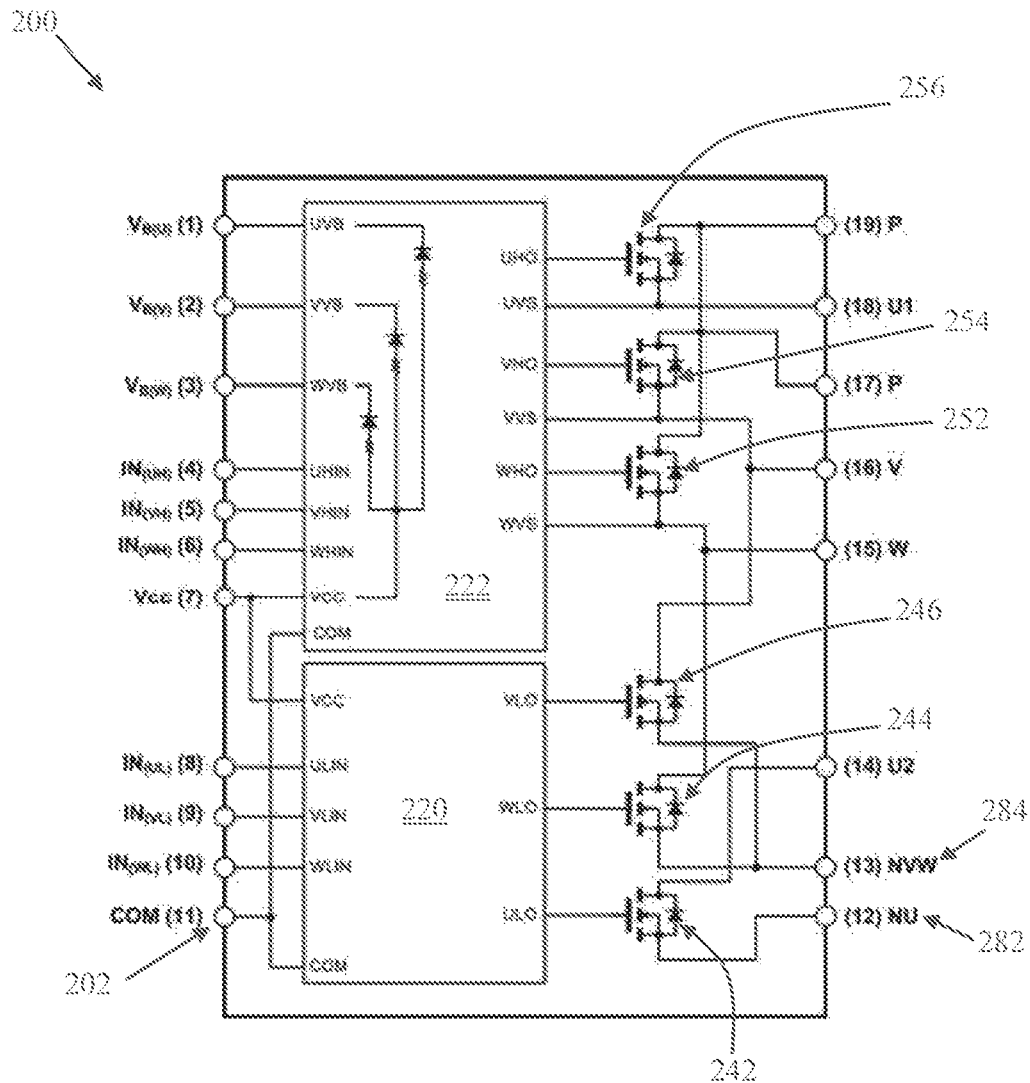
FIG. 2 is another circuit diagram of an IPM for driving a motor in examples of the present disclosure.

FIG. 2 is a circuit diagram of an IPM 200 for driving a motor in examples of the present disclosure. A low voltage IC 220 controls a first transistor 242, a second transistor 244 and a third transistor 246. A high voltage IC 222 controls a fourth transistor 252, a fifth transistor 254 and a sixth transistor 256. There are a first shunt pin 282 and a second shunt pin 284. The first shunt pin 282 is adjacent to the second shunt pin 284. In examples of the present disclosure, there is no other pins between the first shunt pin 282 and the second shunt pin 284. A common pin 202 is on a side opposite to the side of the first shunt pin 282 and the second shunt pin 284.

Figure 3:
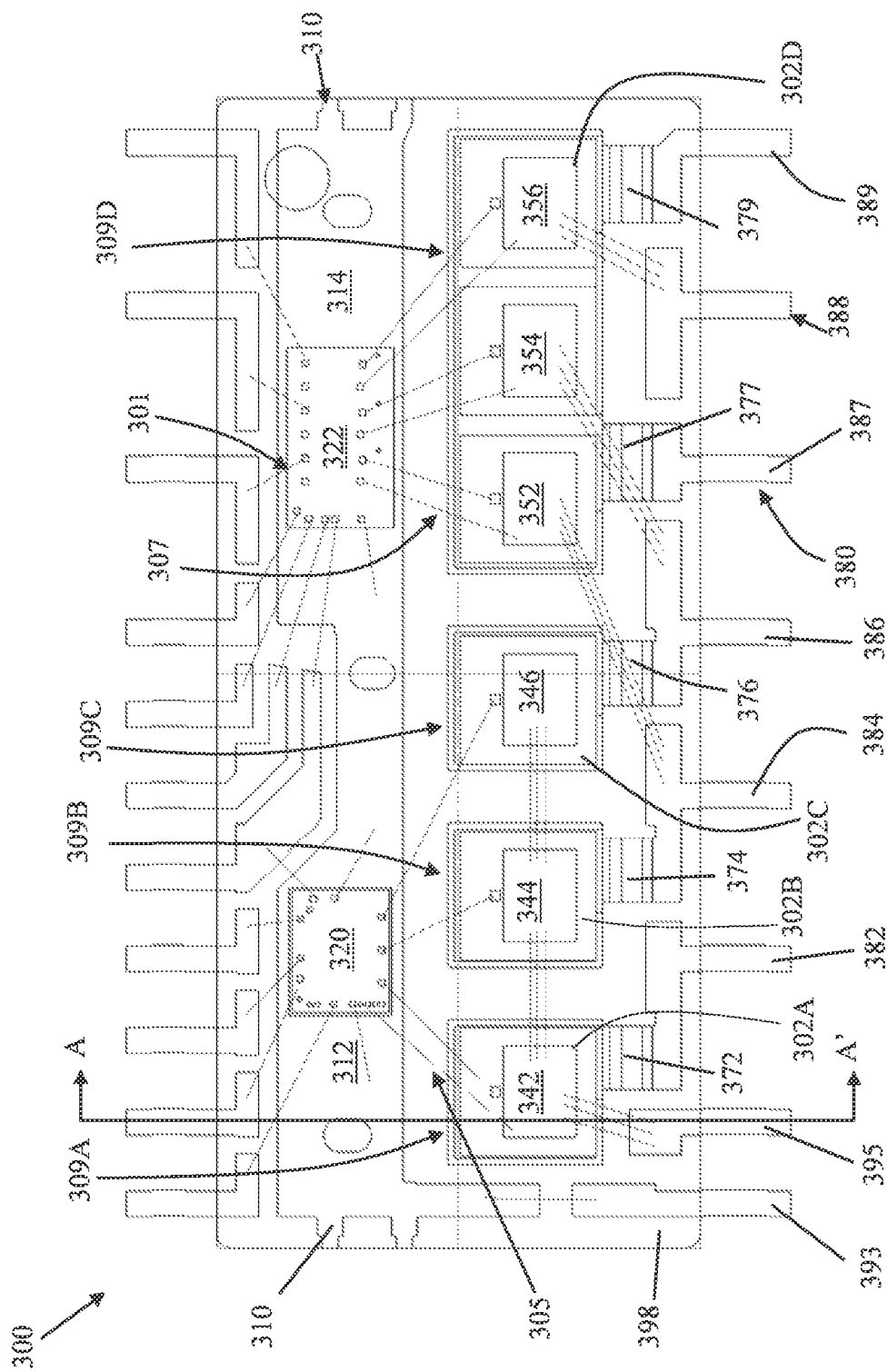
FIG. 3 is a top view of an IPM in examples of the present disclosure.
Figure 5:
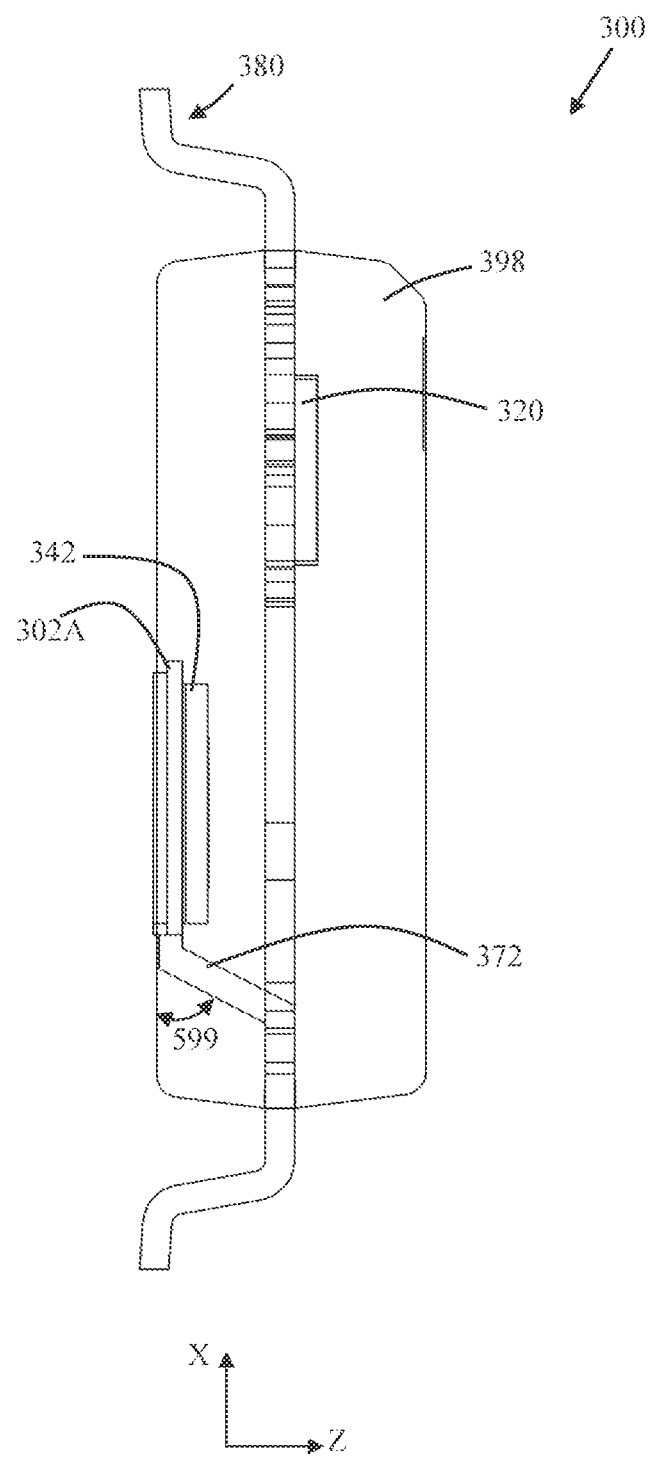
FIG. 5 is a side view, viewing from AA' of FIG. 3, of the IPM of FIG. 3 in examples of the present disclosure.

FIG. 3 is a top view and FIG. 5 is a side view of an IPM 300 in examples of the present disclosure. The IPM 300 comprises a first transistor die supporting element 302A, a second transistor die supporting element 302B, a third transistor die supporting element 302C, and a fourth transistor die supporting element 302D, a first transistor 342, a second transistor 344, a third transistor 346, a fourth transistor 352, a fifth transistor 354, a sixth transistor 356, a first IC die supporting element 312, a second IC die supporting element 314, a tie bar 310, a low voltage IC 320, a high voltage IC 322, a plurality of leads 380, a first slanted section 372, a second slanted section 374, a third slanted section 376, a fourth slanted section 377, a fifth slanted section 379, and a molding encapsulation 398.

The first transistor die supporting element 302A, the second transistor die supporting element 302B, the third transistor die supporting element 302C; and the fourth transistor die supporting element 302D are separated from one another and arranged in lengthwise direction of the module. The first transistor 342 is attached to the first transistor die supporting element 302A with a bottom drain electrode electrically connected to the first transistor die supporting element 302A. The second transistor 344 is attached to the second transistor die supporting element 302B with a bottom drain electrode electrically connected to the second transistor die supporting element 302B. The third transistor 346 is attached to the third transistor die supporting element 302C with a bottom drain electrode electrically connected to the third transistor die supporting element 302C. The fourth transistor 352, the fifth transistor 354, and the sixth transistor 356 are attached to the fourth transistor die supporting element 302D with respective bottom drain electrodes electrically connected to the fourth transistor die supporting element 302D. The second transistor 344 is located between the first transistor 342 and the third transistor 346. The fourth transistor 352 is adjacent to the third transistor 346 and the fifth transistor 354 is located between the fourth transistor 352 and the sixth transistor 356.

The low voltage IC 320 is attached to the first IC die supporting element 312, and the high voltage IC 322 is attached to the second IC die supporting element 314. In the embodiment shown in FIG. 3, the first IC die supporting element 312 and the second IC die supporting element 314 are arranged in lengthwise direction of the module and connected together. In a preferred embodiment, the first IC die supporting element 312 and the second IC die supporting element 314 extend to the tie bar 310 at both ends of the module. The low voltage IC 320 is electrically connected to respective top gate electrodes of the first transistor 342, the second transistor 344, and the third transistor 346 by a first plurality of bonding wires 305. The high voltage IC 322 is electrically connected to respective top gate electrodes of the fourth transistor 352, the fifth transistor 354, and the sixth transistor 356 by a second plurality of bonding wires 307. Alternatively, the low voltage IC 320 and the high voltage IC 322 may be integrated into one IC die disposed on an IC die supporting element connected to the tie bar 310.

Figure 6:
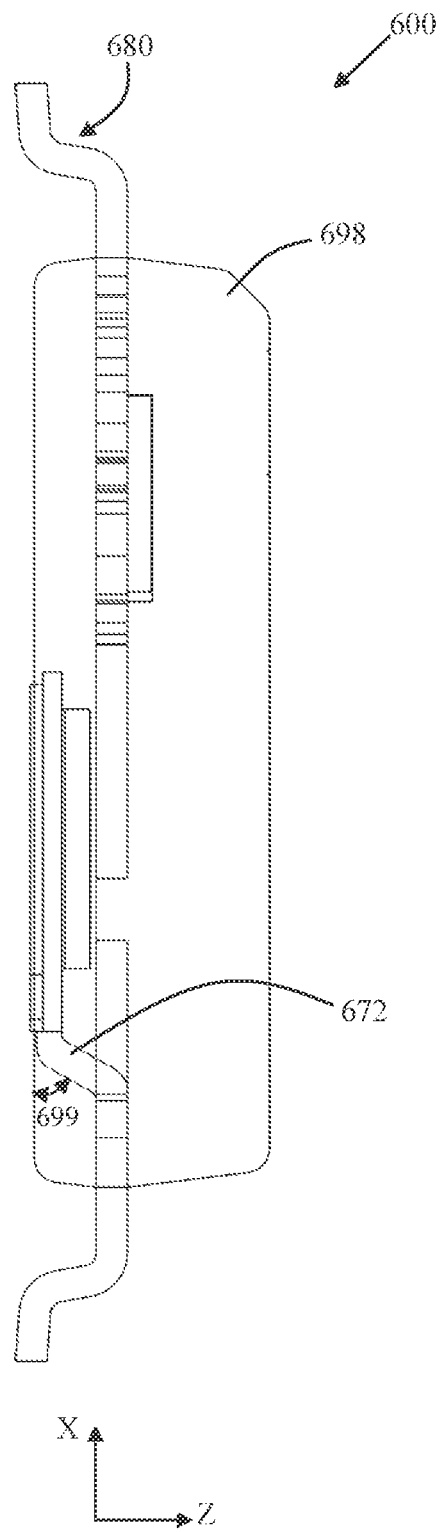
FIG. 6 is a side view of another IPM in examples of the present disclosure.

The first slanted section 372 mechanically and electrically connects the first transistor die supporting element 302A to a lead 382 of the plurality of leads 380. The second slanted section 374 mechanically and electrically connects the second transistor die supporting element 302B to a lead 384 of the plurality of leads 380. A top source electrode of the fourth transistor 352 is electrically connected to the lead 384 such that the bottom drain electrode of the second transistor 344 is electrically connected to the top source electrode of the fourth transistor 352. The third slanted section 376 mechanically and electrically connects the third transistor die supporting element 302C to a lead 386 of the plurality of leads 380. A top source electrode of the fifth transistor 354 is electrically connected to the lead 386 such that the bottom drain electrode of the third transistor 346 is electrically connected to the top source electrode of the fifth transistor 354. The fourth slanted section 377 mechanically and electrically connects the fourth transistor die supporting element 302D to a lead 387 of the plurality of leads 380. The fifth slanted section 379 mechanically and electrically connects the fourth transistor die supporting element 302D to a lead 389 of the plurality of leads 380. A top source electrode of the sixth transistor 356 is electrically connected to a lead 388 separate from lead 382 such that the bottom drain electrode of the first transistor 342 is electrically isolated from the top source electrode of the sixth transistor 356. A total number of slanted sections may vary. In another example, there are four slanted sections. In still another example, there are six slanted section. As shown in FIG. 5 and FIG. 6, each of the slanted section connects to a respective lead at a plane coplanar to the first IC die supporting element 312 and the second IC die supporting element 314.

The molding encapsulation 398 encloses the first transistor 342, the second transistor 344, the third transistor 346, the fourth transistor 352, the fifth transistor 354, the sixth transistor 356, the tie bar 310, the low voltage IC 320, the high voltage IC 322, and the first slanted section 372, the second slanted section 374, the third slanted section 376, the fourth slanted section 377, and the fifth slanted section 379.

The molding encapsulation 398 encloses a majority portion of the first transistor die supporting element 302A, a majority portion of the second transistor die supporting element 302B, a majority portion of the third transistor die supporting element 302C, and a majority portion of the fourth transistor die supporting element 302D. In examples of the present disclosure, a majority portion refers to a range of larger than 50%.

A bottom surface of the first transistor die supporting element 302A is exposed from the molding encapsulation 398. A bottom surface of the second transistor die supporting element 302B is exposed from the molding encapsulation 398. A bottom surface of the third transistor die supporting element 302C is exposed from the molding encapsulation 398. A bottom surface of the fourth transistor die supporting element 302D is exposed from the molding encapsulation 398.

An angle 599 between the first slanted section 372 and a bottom surface of the molding encapsulation 398 is in a range from 45 degrees to 85 degrees. The advantage of a larger angle 599 includes compactness in a horizontal direction X. The advantage of a smaller angle 599 includes compactness in a vertical direction Z and smaller stresses developed in the first slanted section 372. An angle between the second slanted section 374 and a bottom surface of the molding encapsulation 398 is in a range from 45 degrees to 85 degrees. An angle between the third slanted section 376 and a bottom surface of the molding encapsulation 398 is in a range from 45 degrees to 85 degrees. An angle between the fourth slanted section 377 and a bottom surface of the molding encapsulation 398 is in a range from 45 degrees to 85 degrees. An angle between the fifth slanted section 379 and a bottom surface of the molding encapsulation 398 is in a range from 45 degrees to 85 degrees.

In examples of the present disclosure, the first slanted section 372, the second slanted section 374, the third slanted section 376, the fourth slanted section 377, and the fifth slanted section 379 are parallel to one another.

A common lead 393 is electrically connected to the tie bar 310. Top source electrodes of the first transistor 342, the second transistor 344, and the third transistor 346 are connected to a first shunt lead 395. The common lead 393 is adjacent to the first shunt lead 395. In examples of the present disclosure, there is no other lead between the common lead 393 and the first shunt lead 395.

In examples of the present disclosure, the IPM 300 further comprises a plurality of bonding wires 301 enclosed by the molding encapsulation 398. In one example, the plurality of bonding wires 301 are gold wires. In another example, the plurality of bonding wires 301 are copper wires. In still another example, the plurality of bonding wires 301 are aluminum wires.

In examples of the present disclosure, an upper side edge 309A of the first transistor die supporting element 302A, an upper side edge 309B of the second transistor die supporting element 302B, an upper side edge 309C of the third transistor die supporting element 302C, and an upper side edge 309D of the fourth transistor die supporting element 302D are coplanar. The upper side edges of the transistor die supporting elements are adjacent to the first and second IC die supporting elements respectively.

Figure 4:
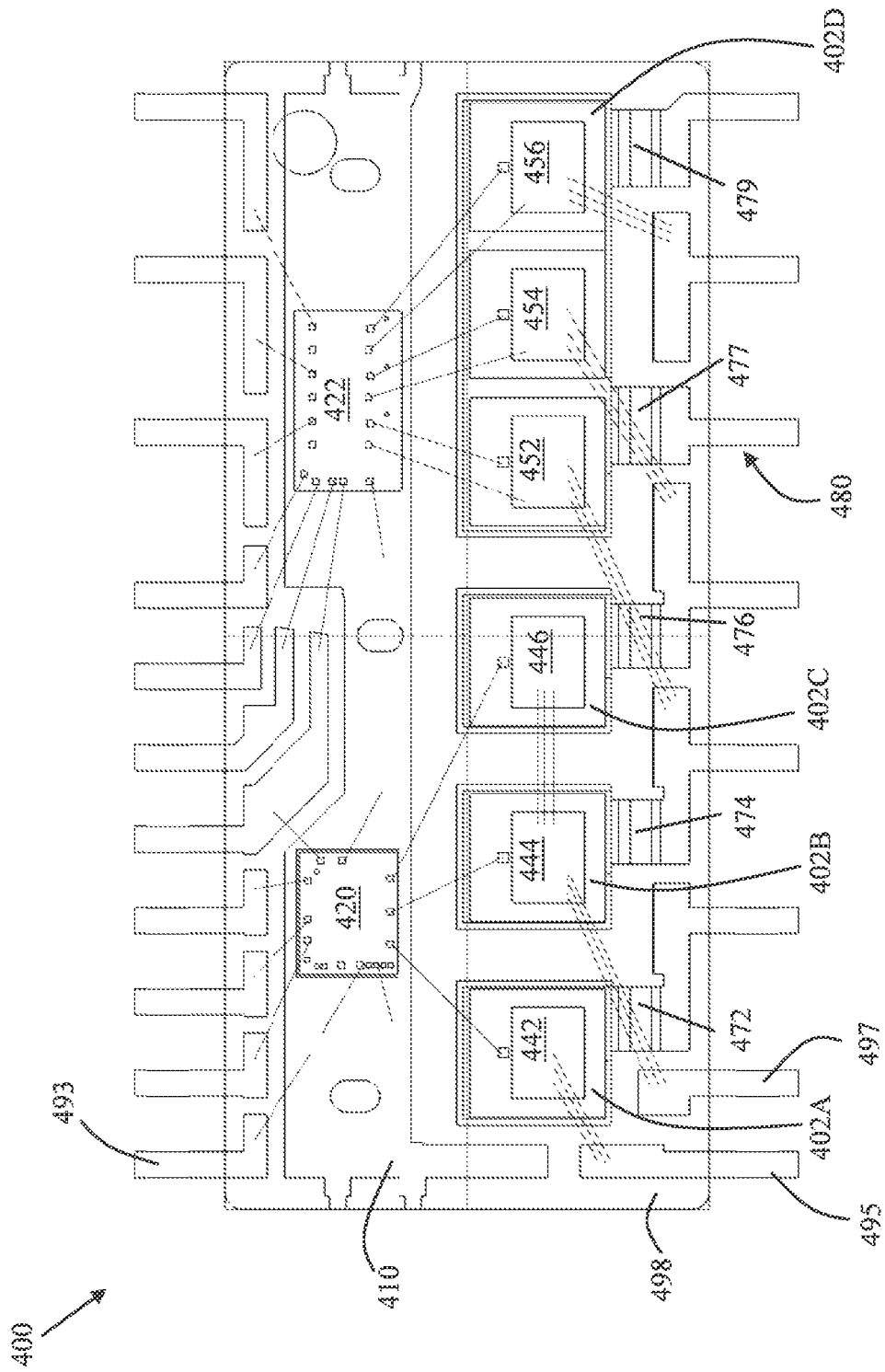
FIG. 4 is a top view of another IPM in examples of the present disclosure.

FIG. 4 is a top view of an IPM 400 in examples of the present disclosure. The IPM 400 comprises a first transistor die supporting element 402A, a second transistor die supporting element 402B, a third transistor die supporting element 402C; and a fourth transistor die supporting element 402D, a first transistor 442, a second transistor 444, a third transistor 446, a fourth transistor 452, a fifth transistor 454, a sixth transistor 456, a tie bar 410, a low voltage IC 420, a high voltage IC 422, a plurality of leads 480, a first slanted section 472, a second slanted section 474, a third slanted section 476, a fourth slanted section 477, a fifth slanted section 479, and a molding encapsulation 498.

A common lead 493 is electrically connected to the tie bar 410. A first shunt lead 495 is electrically connected to a top source electrode of the first transistor 442. A second shunt lead 497 is electrically connected to top source electrodes of the second transistor 444 and the third transistor 446. The common lead 493 is on a side opposite to the side of the first shunt lead 495 and the second shunt lead 497. The first shunt lead 495 is adjacent to the second shunt lead 497. In examples of the present disclosure, there is no other lead between the first shunt lead 495 and the second shunt lead 497. Other connections of IPM 400 are the similar to IPM 300.

FIG. 6 is a side view of an IPM 600 in examples of the present disclosure. The IPM 600 includes a plurality of dual-in-line leads 680. An angle 699 between a first slanted section 672 and a bottom surface of the molding encapsulation 698 is in a range from 45 degrees to 85 degrees. The angle 699 of FIG. 6 is smaller than the angle 599 of FIG. 5. The advantage of a larger angle 599 (than the angle 699) includes compactness in a width of the module in horizontal direction X. The advantage of a smaller angle 699 includes compactness in a thickness of the module in vertical direction Z and smaller stresses developed in the first slanted section 672. As shown in FIG. 5 and FIG. 6, each of the plurality of leads 380 and 680 extends out from a sidewall of the molding encapsulation at a plane coplanar to the first and second IC die supporting elements and bends downward to a plane coplanar to the respective bottom surface of each of the transistor die supporting elements exposed from the bottom of the molding encapsulation.

Figure 7A:
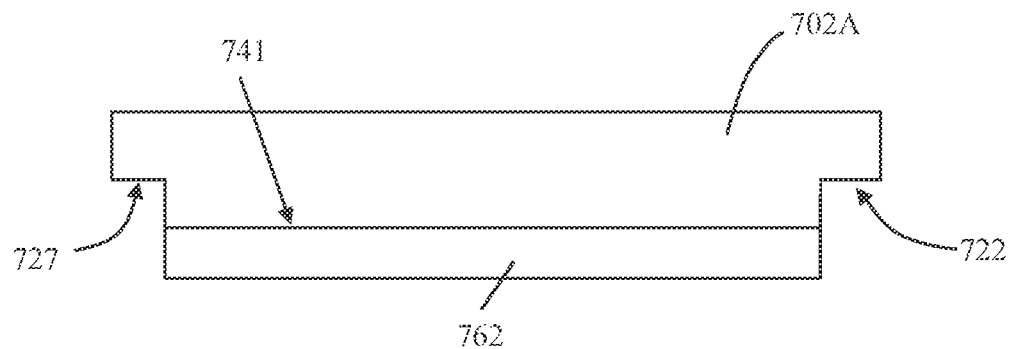
FIGS. 7A and 7B are respective side view and bottom view of a transistor die supporting element and a pad in examples of the present disclosure.
Figure 7B:
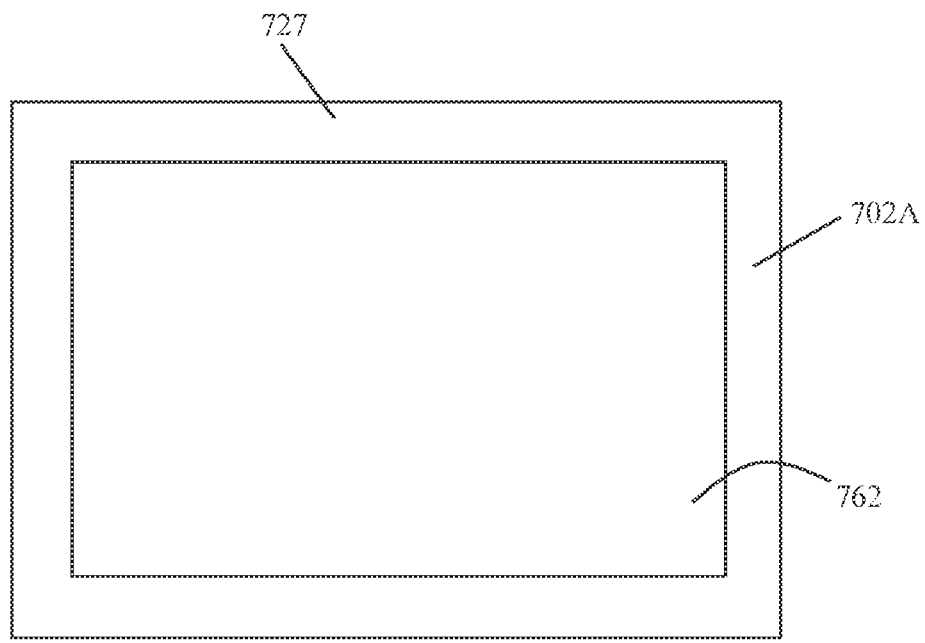

FIGS. 7A and 7B are respective side view and bottom view of a transistor die supporting element 702A with an exposed bottom contact pad 762 in examples of the present disclosure. A bottom portion 722 of the transistor die supporting element 702A comprises a coined peripheral 727. In examples of the present disclosure, upper portion of the coined peripheral 727 is covered by the molding encapsulation 398 of FIG. 3. The bottom surface of the molding encapsulation 398 of FIG. 3 is coplanar to line 741 to expose 30 to 50 microns depth of the contact pad 762 from the bottom of the molding encapsulation.

Those of ordinary skill in the art may recognize that modifications of the embodiments disclosed herein are possible. For example, a total number of slanted sections may vary. Other modifications may occur to those of ordinary skill in this art, and all such modifications are deemed to fall within the purview of the present invention, as defined by the claims.

The invention claimed is:

1. An intelligent power module (IPM) for driving a motor, the IPM comprising:
   one or more transistor die supporting elements;
   one or more transistors mounted on the one or more transistor die supporting elements;
   a first integrated circuit (IC) die supporting element;
   a first IC disposed on the first IC die supporting element;
   a plurality of bond wires connecting the first IC to at least one of the one or more transistors;
   a plurality of leads;
   one or more slanted sections connecting the one or more transistor die supporting elements to the plurality of leads; and
   a molding encapsulation completely enclosing the one or more transistors, the first IC die supporting element, the first IC, and the one or more slanted sections;
   wherein a respective bottom surface of each of the one or more transistor die supporting elements are exposed from a bottom of the molding encapsulation;
   wherein the one or more transistor die supporting elements comprise:
   a first, second, third and fourth transistor die supporting elements separated from one another; and
   wherein the one or more transistors comprise:
   a first transistor attached to the first transistor die supporting element;
   a second transistor attached to the second transistor die supporting element;
   a third transistor attached to the third transistor die supporting element; and
   a fourth, fifth, and sixth transistors attached to the fourth transistor die supporting element.

2. The IPM of claim 1, wherein a respective angle between each of the one or more slanted sections and a bottom surface of the molding encapsulation is in a range from forty-five degrees to eighty-five degrees.

3. The IPM of claim 1, wherein a respective bottom portion of the one or more transistor die supporting elements comprises a coined peripheral.

4. The IPM of claim 3, wherein each of the one or more transistor die supporting elements comprises a bottom contact pad exposed from a bottom surface of the molding encapsulation.

5. The IPM of claim 1, wherein each of the one or more slanted sections connecting to one of the plurality of leads at a plane coplanar to the first IC die supporting element.

6. The IPM of claim 5, wherein each of the plurality of leads extends out from a sidewall of the molding encapsulation at the plane coplanar to the first IC die supporting element and bends downward to a plane coplanar to the respective bottom surface of each of the one or more transistor die supporting elements exposed from the bottom of the molding encapsulation.

7. The IPM of claim 6, further comprises
   a second IC die supporting element; and
   a second IC disposed on the second IC die supporting element;
   wherein the second IC die supporting element connects to the first IC die supporting element.

8. The IPM of claim 7, wherein another plurality of bond wires connecting the second IC to at least one of the one or more transistors not connected to the first IC.

9. An intelligent power module (IPM) for driving a motor, the IPM comprising:
   a first, second, third and fourth transistor die supporting elements separated from one another;
   a first transistor attached to the first transistor die supporting element;
   a second transistor attached to the second transistor die supporting element;
   a third transistor attached to the third transistor die supporting element;
   a fourth, fifth, and sixth transistors attached to the fourth transistor die supporting element;
   a first integrated circuit (IC) die supporting element;
   a second IC die supporting element;
   a low voltage IC attached to the first IC die supporting element; the low voltage IC being electrically connected to the first, second and third transistors;
   a high voltage IC attached to the second IC die supporting element, the high voltage IC being electrically connected to the fourth, fifth, and sixth transistors;
   a plurality of leads;
   a first slanted section connecting the first transistor die supporting element to the plurality of leads;
   a second slanted section connecting the second transistor die supporting element to the plurality of leads;
   a third slanted section connecting the third transistor die supporting element to the plurality of leads;
   a fourth slanted section connecting the fourth transistor die supporting element to the plurality of leads; and
   a molding encapsulation enclosing the first, second, third, fourth, fifth, and sixth transistors, the first and second IC die supporting elements, the low voltage IC, the high voltage IC, and the first, second, third, and fourth slanted sections;

wherein a respective bottom surface of each of the first, second, third, and fourth transistor die supporting elements are exposed from the molding encapsulation.

10. The IPM of claim 9, wherein a respective angle between each of the first, second, third, and fourth slanted sections and a bottom surface of the molding encapsulation is in a range from forty-five degrees to eighty-five degrees.

11. The IPM of claim 9, wherein a respective bottom portion of the first, second, third, and fourth transistor die supporting elements comprises a coined peripheral.

12. The IPM of claim 11, wherein each of the first, second, third, and fourth transistor die supporting elements comprises a bottom contact pad exposed through a bottom surface of the molding encapsulation.

13. The IPM of claim 9, wherein the plurality of leads comprises
a common lead electrically connecting to a tie bar; and
a first shunt lead electrically connecting to the first transistor; wherein
wherein the common lead is adjacent to the first shunt lead.

14. The IPM of claim 9, wherein the plurality of leads comprises
a first shunt lead electrically connecting to the first transistor; and
a second shunt lead electrically connecting to the second transistor.

15. The IPM of claim 9, wherein the first, second, third, fourth, fifth, and sixth transistors are metal-oxide-semiconductor field-effect transistors (MOSFETs).

16. The IPM of claim 9, wherein the first, second, third, fourth, fifth, and sixth transistors are insulated gate bipolar transistors (IGBTs).

17. The IPM of claim 9, wherein upper side edges of the first, second, third, and fourth transistor die supporting elements are co-planar.

18. The IPM of claim 9, wherein the low voltage IC is electrically connected to the first, second and third transistors by a plurality of bonding wires.

19. The IPM of claim 18, wherein the high voltage IC is electrically connected to the fourth, fifth, and sixth transistors by another plurality of bonding wires.

20. The IPM of claim 9, wherein a fifth slanted section connecting the fourth transistor die supporting element to the plurality of leads;
wherein the first, second, third, fourth, and fifth slanted sections are parallel to one another.

* * * * *